United States Patent
Mimura et al.

[11] Patent Number: 5,880,816
[45] Date of Patent: Mar. 9, 1999

[54] PROCESS FOR EXPOSING THE PERIPHERAL AREA OF A SEMICONDUCTOR WAFER FOR REMOVING UNNECESSARY RESIST ON THE SEMICONDUCTOR WAFER AND A DEVICE FOR EXECUTING THE PROCESS

[75] Inventors: Yoshiki Mimura; Takeshi Minobe; Shinetsu Miura, all of Yokohama, Japan

[73] Assignee: Ushiodenki Kabushiki Kaisha, Tokyo, Japan

[21] Appl. No.: 725,020

[22] Filed: Oct. 2, 1996

[30] Foreign Application Priority Data

Oct. 2, 1995 [JP] Japan ................................ 7-276207

[51] Int. Cl.$^6$ ........................... G03B 27/42; G03B 27/52
[52] U.S. Cl. ............................. 355/53; 355/67; 356/375; 356/400
[58] Field of Search ................... 355/53, 67, 71; 356/399, 400, 401, 375; 250/491.1

[56] References Cited

U.S. PATENT DOCUMENTS

| | | | |
|---|---|---|---|
| 5,028,955 | 7/1991 | Hayashida et al. | 355/53 |
| 5,168,021 | 12/1992 | Arai et al. | 355/53 |
| 5,168,304 | 12/1992 | Hattori | 355/53 |
| 5,289,263 | 2/1994 | Kiyokawa et al. | 355/53 |
| 5,329,354 | 7/1994 | Yamamoto et al. | 356/349 |
| 5,361,121 | 11/1994 | Hattori et al. | 355/53 |
| 5,420,663 | 5/1995 | Nakajima et al. | 355/53 |

FOREIGN PATENT DOCUMENTS

| | | |
|---|---|---|
| 05-3153 | 1/1993 | Japan . |
| 07-75220 | 8/1995 | Japan . |
| 2534567 | 6/1996 | Japan . |

*Primary Examiner*—Alan A. Mathews
*Attorney, Agent, or Firm*—Sixbey, Friedman, Leedom & Ferguson; David S. Safran

[57] ABSTRACT

To effect exposure of the peripheral area of a wafer to remove an unnecessary resist with a step shape in a development process with high precision and ease, even if the position has errors, in which a circuit pattern is formed on a semiconductor wafer in a preceding process, according to the invention, before exposing the unnecessary resist on a wafer outside of the area on which a pattern is formed, the position of a singular shaped area, such as an "orientation flat" or the like is determined by a unit for determining the peripheral edge area of the wafer, and the rotating carrier is driven and the wafer is rotated until the singular shaped area is positioned in a predetermined position. Furthermore, according to the invention, a unit for determining the alignment marks computes and stores the positions of predetermined alignment marks, by which positional errors in the location in which the circuit pattern is formed are corrected. Then, the rotating carrier is driven again, and fine adjustment of the position of the exposure area on the wafer is performed.

4 Claims, 10 Drawing Sheets position which alignment mark WAM2 is to reach position to which alignment mark WAM1 is to come position to which alignment mark WAM2 is to come position to which alignment mark WAM1 is to come

PROCESS FOR EXPOSING THE PERIPHERAL AREA OF A SEMICONDUCTOR WAFER FOR REMOVING UNNECESSARY RESIST ON THE SEMICONDUCTOR WAFER AND A DEVICE FOR EXECUTING THE PROCESS

BACKGROUND OF THE INVENTION

1. Field of the Invention

The invention relates to a process for exposing the peripheral area of a wafer, a process which is used for removal of an unnecessary resist on a wafer in a development process, and a device for exposure. The invention relates especially to such a process in which the unnecessary resist has a step shape and where the process is a development process performed in an exposure device.

2. Description of Related Art

In the manufacture of a semiconductor device, for example, an IC, LSI or the like, the photoresist (hereafter called a resist) is applied to the surface of a semiconductor wafer, such as a silicon wafer or the like. Next, a circuit pattern is exposed and developed, and thus, a resist pattern is formed. This resist pattern is used as a mask, ion implantation, etching, lift-off or similar processing being done. To apply the resist to the semiconductor wafer (hereafter called a wafer), conventionally, a spin coat method is used to make the applied thickness of the resist film uniform. In doing so, the wafer is rotated as the resist is applied in the center position of the wafer surface. The resist is distributed over the entire surface of the wafer by centrifugal force. In this way, the resist is also applied to the peripheral area of the wafer.

The peripheral area of a wafer, however, is only rarely used as an area in which the pattern is formed. This is because the wafer is often transported and held using its peripheral area when the wafer is subjected to various treatment processes, and because distortion of the pattern often occurs in the peripheral area, and therefore, the yield is low.

In the case in which the resist is a positive resist, the peripheral area is therefore not exposed, and as a result, the resist remains in the peripheral area even after development. The resist which has remained in the peripheral area causes impurities on peripheral devices, and as a result thereof, impurities of the wafer surface and thus a reduction in yield due to loosening or the like during transportation and holding of the wafer. Where, in particular, enhancing the function of the integrated circuit and minimization thereof proceed, this is a serious problem at present.

Therefore, a proposal has been advanced for removing the unnecessary resist in the peripheral area in the development process. To do this, a process for exposing the peripheral area of a wafer is carried out in which, regardless of the process of exposing the circuit pattern in the area in which the pattern is formed, the unnecessary resist is exposed in the peripheral area. In this process of exposing the peripheral area, light supplied by optical fibers is emitted locally onto the peripheral area as the wafer to which the resist has been applied is rotated. In this way, ring-like exposure is accomplished.

On the other hand, recently, in the exposure of the circuit pattern, a checkered pattern is gradually exposed on the wafer surface to which the resist has been applied by means of a reduction projection exposure device of the stepper type. In this case, the peripheral area in which a circuit pattern which correctly corresponds to a chip, i.e., the unnecessary resist part, cannot be exposed, so that it becomes step-shaped and its size and shape also change variously during each exposure. An unnecessary resist of this type with a step shape, likewise, causes the above described decrease of yield because there are cases in which, in the process of production of the semiconductor device, loosening or the like occurs.

Removal of this unnecessary step-shaped resist is produced, for example, using the device disclosed in Japanese patent disclosure document HEI 3-242922, by local irradiation of the unnecessary resist with light delivered by optical fibers, as the light delivered by the optical fibers is moved along the step-shaped pattern of the unnecessary resist.

In the following, using the device shown in FIG. 9 for exposing the peripheral area of a wafer, the conventional process for exposing the peripheral area of a wafer is described, in which the step-shaped unnecessary resist is exposed in the peripheral area of the wafer W shown in FIGS. 10(a) and 10(b).

Ordinarily, circuit pattern CP is formed such that an orientation flat which shows the crystal orientation of wafer W and which is hereafter called "ori-fla", or a peripheral edge shape which is called a "notch", are present. Here, FIG. 10(a) shows the case of a wafer which is provided an "ori-fla" and FIG. 10b the case of a wafer provided with a "notch".

(1) First, coordinate data of an exposure area in the orthogonally intersecting X-Y coordinates, shown in FIGS. 10(a) & (b), are stored by controller 12, shown in FIG. 9. The X-direction and Y-direction of the X-Y coordinates shown here agree with the directions of movement of X-carrier 8 and Y-carrier 10, which move in orthogonally intersecting directions. The coordinate data here relate to an instant at which the center of the circular peripheral area of wafer W and the center of rotating carrier 1 agree with one another.

Furthermore, a correlation is established between these coordinate data and the information on the positions of X-carrier 8 and Y-carrier 10, which are determined by means for determining the X-carrier position 9 and by means for determining the Y-carrier position 11.

Furthermore, for these coordinate data, a positional relationship is also considered between an exit part 6 of optical fibers 5 which deliver exposure light from a light source 4 for purposes of exposure, and a means for determining the peripheral edge area of the wafer 13 which is described below. The exposure light source 4 consists of a discharge lamp, for example, which emits light which contains, ultraviolet rays as the exposure light, by which the resist is exposed to the action of exposure light, and of a focussing mirror for focussing the emitted ultraviolet rays and the like.

(2) X-carrier 8 and Y-carrier 10 are driven. Means for determining the peripheral edge area of the wafer 13, which is installed in retaining arm 7, is moved as far as the peripheral edge of wafer W.

The position information of X-carrier 8 and Y-carrier 10 is determined by a means for determining the X-carrier position 9 and by a means for determining the Y-carrier position 11 and is sent to controller 12. This means that drive control of the X-carrier 8 and the Y-carrier 10 is a loop control.

Means for determining the area of the peripheral edge of the wafer 13 consists, for example, of a light emitting diode 51 for emitting nonexposure light by which the resist is not exposed to the action of exposure light, a lens 52 for converting the nonexposure light into parallel light, and a CCD array 53. The nonexposure light, as parallel light which has passed through lens 52, is partially shielded by wafer W and passes through the outside of an edge part of the wafer W, as is illustrated in FIG. 11. This transmitted light is detected by CCD array 53.

(3) Rotary drive device 2 is driven. Rotating carrier 1, on which the wafer W is held in place by suction, is rotated once. During rotation of wafer W, the position of the "ori-fla" or "notch" edge part of wafer W changes. Furthermore, it also changes according to the amount of deviation of the center of wafer W from the center of rotation of rotating carrier 1 when wafer W is put in place. During rotation of the rotating carrier, therefore, the position of the nonexposure light detected by the CCD array 53 changes according to the angle of rotation of the rotating carrier 1.

This means that the angle of rotation of rotating carrier 1 is determined by an angle of rotation reading device 3, and for each angle of rotation, the information, which pixel under each pixel of CCD-array 53 has been detected by the nonexposure light, is ascertained. In this way, position information about the edge part of wafer W can be obtained, the angle of rotation of the rotating carrier 1 being called the parameter.

(4) The information on the position of the edge part of above described wafer W is computed at controller 12, by which an "ori-fla" position or a "notch" position is determined, and furthermore, the amount of deviation of the center of rotation of rotating carrier 1 from the center of wafer W is computed. For computing the amount of this deviation, for example, the process disclosed in Japanese patent disclosure document HEI 1-243492 is used.

(5) On the basis of the above described computed data, rotary drive device 2 is driven and rotating carrier 1 is rotated until the "ori-fla" position becomes parallel to the X-axis of the X-Y coordinate system. In the case of the "notch", rotary drive device 2 is driven and rotating carrier 1 is rotated until a straight line between the "notch" and the center of wafer W becomes parallel to the Y-axis.

Furthermore, by using the process disclosed in Japanese patent disclosure document HEI 5-3153, it can be confirmed whether the above described positioning has been done correctly. This means that, in the case of "ori-fla," the means for determining the peripheral edge area of the wafer 13 is moved along the "ori-fla" in the direction of the X-axis, the "ori-fla" position is determined, and the angle between the "ori-fla" and X-axis is ascertained. If necessary fine adjustment is performed.

(6) Furthermore, based on the amount of deviation computed to exist in step (4), the coordinate data stored in step (1) are corrected. Coordinate data (X,Y) are corrected, for example, in FIG. 12, as (X-dx, Y-dy). Furthermore, for these coordinate data, as was described above, the amount of deviation of the position of the exit part 6 from the position of the means for determining the peripheral edge area of the wafer 13 is taken into account.

(7) Based on the coordinate data corrected in step (6), the X-carrier 8 and the Y-carrier 10 are subjected to drive control. Thus, the position of the light irradiated from exit part 6 is moved to a predetermined initial position.

(8) Shutter drive device 43 is moved and shutter 41 is opened. Exposure light is emitted from exit part 6.

(9) Based on the coordinate data corrected in step (6), X-carrier 8 and Y-carrier 10 are subjected to drive control and a step-shaped exposure area is exposed.

(10) Furthermore, in the case in which the stroke lengths of the movements of X-carrier 8 and Y-carrier 10 are not very great, after exposure of a zone of the exposure area which can be exposed, rotating carrier 1 can be rotated 90° each time, and after rotation, the respective exposure area can be exposed.

As was described above, in the case of exposure of the step-shaped unnecessary resist, the exposure area, which was ascertained by assuming the "ori-fla" position (or "notch" position), is stored. Furthermore, here, the position of the light irradiating from the exit part 6 in the X-Y directions, which orthogonally intersect each other, was controlled accordingly and thus exposure was performed. In doing so, it was assumed that the exposure area of the unnecessary resist is positioned with reference to the "ori-fla" position (or "notch" position) in a predetermined direction.

This means that, in the case in which the "ori-fla" was assumed, it is assumed that sides L1, L3 of the inside of the unnecessary resist area are parallel to the X-axis, which agrees with the "ori-fla" direction, and that the sides L2, L4 are parallel to the Y-axis, which orthogonally intersects the X-axis, as is illustrated in FIG. 10(*a*).

In the case in which the "notch" was assumed, it is assumed that sides L6, L8 of the inside of the unnecessary resist area are parallel to the Y-axis, which agrees with the direction which occurs between the corner point of the "notch" and the center of the wafer, and that sides L5, L7 are parallel to the X-axis, which orthogonally intersects the Y-axis, as is illustrated in FIG. 10(*b*).

However, there are cases in which, in a process of exposure and formation of a circuit pattern which is performed before this process of exposing the peripheral area of the wafer, the position of the circuit pattern CP, i.e., the exposure area of the unnecessary resist, is not positioned in a predetermined direction with respect to the "ori-fla" position or the "notch" position as a result of errors in positioning or the like, as is shown, for example, in FIG. 13. In FIG. 13, examples are shown in which a circuit pattern CP is at an angle θ with respect to the X-axis. As was described above, therefore, exposure of a predetermined area becomes impossible, even if the deviation of the position of the center of rotation of the rotating carrier 1 from the position of the center of wafer W is corrected.

Therefore, after exposure and formation of the circuit pattern, the circuit pattern on wafer W must be observed separately before exposure of the peripheral area of the wafer is performed, angle θ shown, for example, in FIG. 13, must be determined in above described step (5), rotary drive device 2 must be driven until the "ori-fla" position or the "notch" position becomes parallel to the X-axis of the X-Y coordinate system, and rotating carrier 1 must be corrected by angle θ during rotation.

This deviation of the exposure area changes in the process of exposure and formation of the circuit pattern according to each wafer or each production lot. Therefore, an observation must be taken each time and an observation device for this purpose must be positioned in addition.

Furthermore, with respect to the deviation of the exposure area of the unnecessary resist which is formed when rotating carrier 1 is rotated by angle θ, a correction must be performed, by which a complex computation becomes necessary.

In order to eliminate the above described disadvantages of the prior art, at two locations on wafer W, the present inventors have positioned alignment marks WAM (WAM1, WAM2) in a predetermined positional relationship with respect to circuit pattern CP, as is illustrated in FIG. 2. The inventors have found a new process in which, by observation of these alignment marks WAM and based on the observation data thereof, the above described amount of deviation is automatically corrected.

FIG. 14 shows an arrangement of an alignment unit for observing alignment mark WAM. Alignment unit 20 comprises a nonexposure light irradiation device 21, half mirror 22, mirror 23, projection lenses 24, 25, and an optical sensor 26 which is formed by a CCD camera or the like. Reference number 27 designates a monitor which picks up signals from optical sensor 26 and sends the image data of alignment mark WAM (position data of the coordinates on the monitor) to controller 12.

Correction of the amount of deviation is performed as follows:

(a) According to above described step (6) alignment unit 20 is inserted in a predetermined position in which alignment mark WAM can be observed, as is shown in FIG. 14. Because alignment marks WAM (WAM1, WAM2) are present at two locations, two alignment units 20 are also inserted.

(b) Nonexposure light irradiation device 21 emits nonexposure light and alignment mark WAM on wafer W is illuminated. The image of illuminated alignment mark WAM is determined via mirror 23, half mirror 22 and projection lenses 24, 25 by means of optical sensor 26 and is picked up by monitor 27.

(c) Image data of two alignment marks WAM (WAM1, WAM2) are computed, and angle θ is computed as the amount of deviation.

(d) Rotating carrier 1 continues to be rotated by computed angle θ, so that circuit pattern CP (i.e., the exposure area) is in a predetermined positional relationship relative to the X-Y coordinates.

(e) Based on the coordinate data corrected in step (9), the position is computed in which the respective alignment mark WAM is to be actually picked up on monitor 27.

The image of alignment mark WAM actually picked up on monitor 27, in this process, is picked up due to the influence of further rotation of rotating carrier 1 by angle θ in a position which deviates from the above described position in which picking-up of the alignment mark is to be achieved.

(f) The difference between the position in which alignment mark WAM is actually to be picked up on the monitor 27, and the position in which it is actually picked up is determined and computed. The coordinate data corrected in step (6) are further corrected.

(g) After the above described correction, the emission of nonexposure light from nonexposure light irradiation device 21 is stopped. Alignment unit 20 is removed from one predetermined position to a removal position.

Then the steps beginning with (7) are followed.

In the above described correction process, using the alignment marks which the inventors found, the means for observing wafer W is positioned integrally with the device for exposing the peripheral area of the wafer. Therefore, it is no longer necessary to position an observation device in addition. Furthermore, a correction can be performed relatively easily with respect to the deviation of the exposure area of the unnecessary resist which arises when rotating carrier 1 is rotated by angle θ.

However, in this case, the following disadvantages arise:

(1) When each correction of the amount of deviation of circuit pattern CP is performed, alignment units 20 are inserted into the predetermined positions and are removed to the removal positions. If, however, there are errors in the positions in which the insertions into the predetermined positions are performed (positions A and B in FIG. 15), the image data of two alignment marks WAM (WAM (A) and WAM (B)) change, as shown in FIG. 15.

Two alignment units 20 are, however, each inserted and removed independently of one another. The resulting position data have no correlation with the position data of exit end 6 (position data of X-carrier 8 and Y-carrier 10: X-Y coordinate system).

(2) If the position accuracy of two alignment units 20 is not high, therefore, a deviation of the relative position relationship with respect to the X-Y coordinate system, which is the motion coordinate system of the X-carrier 8 and Y-carrier 10, occurs. As a result, errors occur in the correction of the coordinate data as rotating carrier 1 continues to rotate by angle θ in above described steps (e) and (f).

(3) Therefore, devices for positioning of alignment units 20 with high accuracy are necessary; this causes increased costs.

(4) Furthermore, the disadvantage of enlarging the device arise since several alignment units are necessary.

SUMMARY OF THE INVENTION

The first object of the invention is to devise a process which accomplishes exposure of the peripheral area of a wafer to remove unnecessary resist, which has a step shape, in a development process with high precision and ease, even if inaccurate positioning has resulted from a preceding process in which a circuit pattern was formed.

Another object of the invention is to devise a small device for exposure of the peripheral area of a wafer with low costs, in which the above described exposure of the peripheral area of a wafer can be performed.

The present invention, in accordance with preferred embodiments thereof, provides processes and functions in which, before exposure of an unnecessary resist on a wafer outside of an area in which a pattern is formed, the position of a singular point is determined with respect to the shape of the wafer, such as an "ori-fla", "notch" or the like, in which the wafer is rotated until the above described singular point is positioned in a predetermined position in which the predetermined two points of the above described pattern or the positions of two alignment marks are computed and stored, which have a predetermined relationship to the above described pattern, and which are arranged separately from the above described pattern, in which the angle between one direction of movement of the above described exit end or one direction of movement of a rotating carrier and the above described pattern is determined, and in which the wafer continues to be rotated such that the above described angle is 0 degrees or 90 degrees.

This means that the unnecessary resist is not exposed on the basis of a singular point with respect to the shape of the wafer that is assumed. Rather, exposure is enabled in which the circuit pattern is observed, in which the wafer is positioned to the predetermined position, and in which the pattern is assumed. Therefore, the exposure of the peripheral area of a wafer to remove the unnecessary resist with the step shape in a development process can be done with high accuracy and ease, even if the position has errors in which the circuit pattern is formed in a preceding process.

If, in particular, the predetermined two points of the above described pattern are used, it is not necessary to position alignment marks in addition; this facilitates practical effort.

Furthermore, the invention, as a result of features thereof, has the following effects:

(1) Due to the wafer observation means for observing the errors in the position in which in the preceding process the circuit pattern is formed, an observation device in addition is unnecessary.

(2) The exit end of the optical fibers (light guide fibers) and the above described observation means are fixed integrally such that they are in a predetermined positional relationship to one another. They can, furthermore, be moved in orthogonal directions. The movement coordinate systems of the exit end and of the observation means therefore agree fully with one another. Accordingly, correction of the errors of the position in which the circuit pattern is formed can always be achieved with high accuracy, and therefore, a positioning device with high accuracy for the observation means, which is necessary if the above described coordinate systems are independent, is no longer necessary.

(3) Furthermore, the measure by which an observation means is subjected to drive control, by which the predetermined two points of the pattern on the above described wafer or the two alignment marks which have a predetermined relationship to the above described pattern and which are positioned separately from the above described pattern are determined and stored separately, making several alignment units unnecessary. Therefore, a small device for exposing the peripheral area of a wafer with low costs can be devised.

Furthermore, other aspects of the invention have the following effects:

(1) An additional observation device is unnecessary due to the wafer observation means for observing the errors in the position in which in the preceding process the circuit pattern is formed.

(2) The exit end of the optical fibers and the above described observation means are attached integrally such that they are in a predetermined positional relationship to one another. Furthermore, the swivelling rotating carrier on which the wafer is placed can be moved in orthogonal directions. The correlation between the position of the exit end and the observation means which are attached integrally to one another and the position of the rotating carrier on which the wafer is placed therefore remains the same.

As a result, correction of the errors of the position in which the circuit pattern is formed can always be performed with high accuracy, and therefore, there is no longer any need for a highly accurate positioning device for the observation means, which is necessary if the above described coordinate systems are independent.

(3) Furthermore, the measure by which the rotating carrier is subjected to drive control, by which the predetermined two points of the pattern on the above described wafer or the two alignment marks which have a predetermined relationship to the above described pattern, and which are positioned separately from the above described pattern are determined and stored separately, makes several alignment units unnecessary. Therefore, a small device for exposing the peripheral area of a wafer with low costs can be devised.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
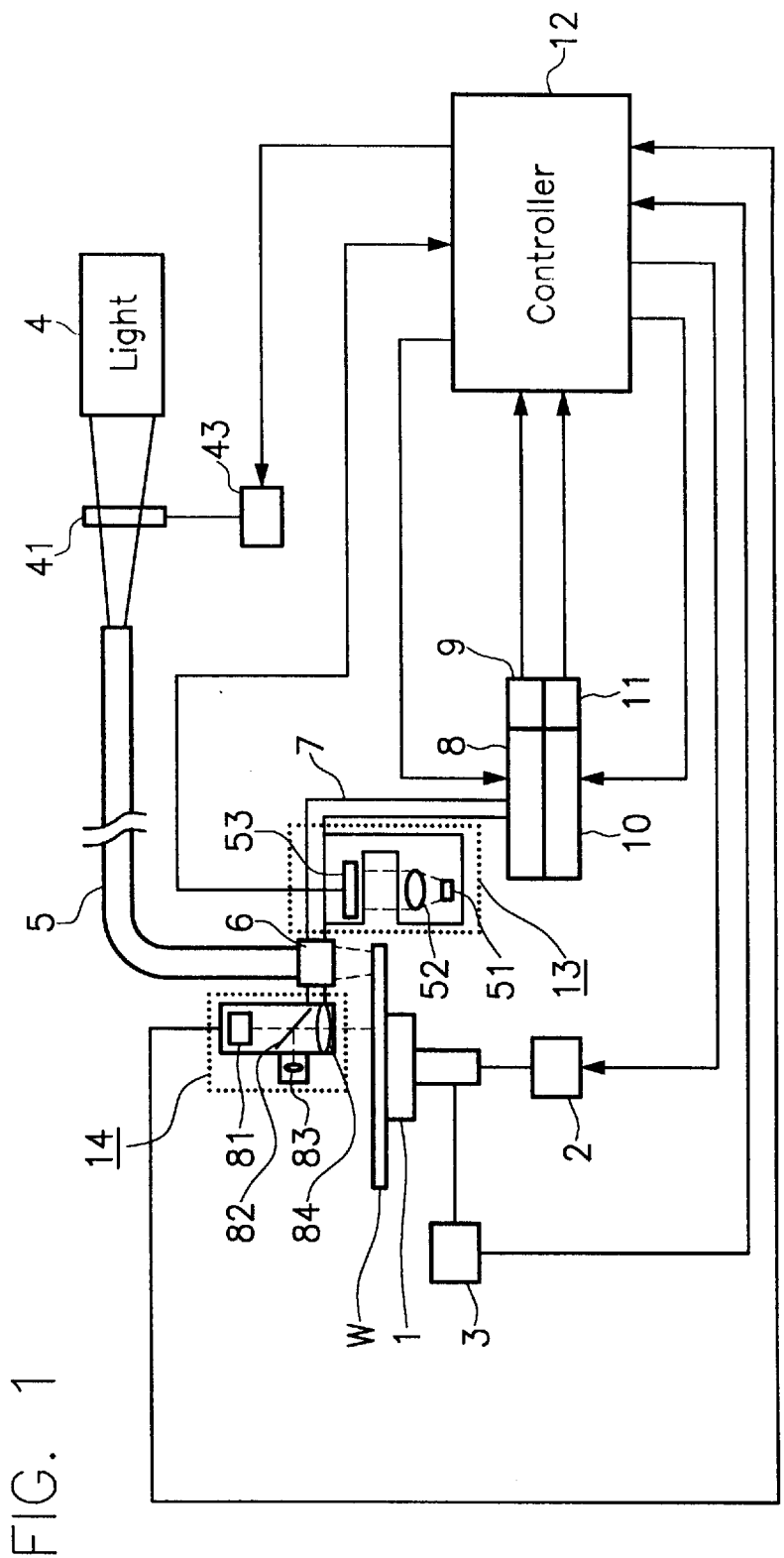
FIG. 1 shows a schematic of a first embodiment of a device according to the invention for exposure of the peripheral area of a wafer.
Figure 9:
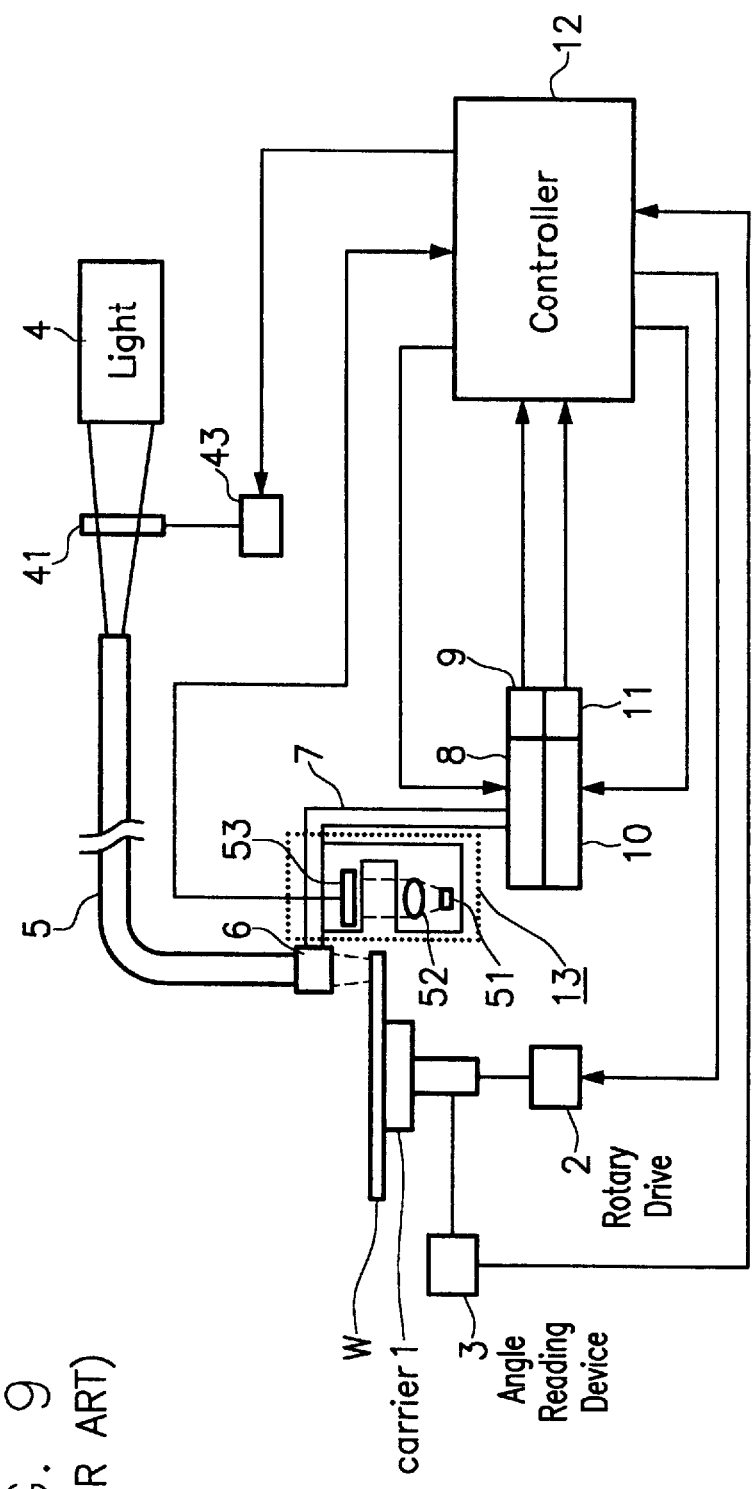
FIG. 9 shows a schematic of one example of a conventional device for exposure of the peripheral area of a wafer.
Figure 10A:
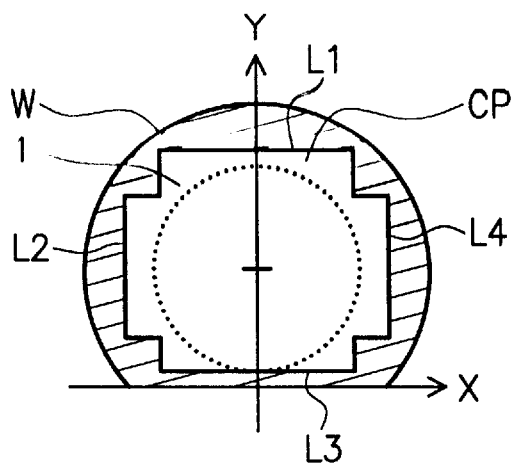
FIG. 10 shows a schematic of the exposure area for the device of FIG. 9.
Figure 10B:
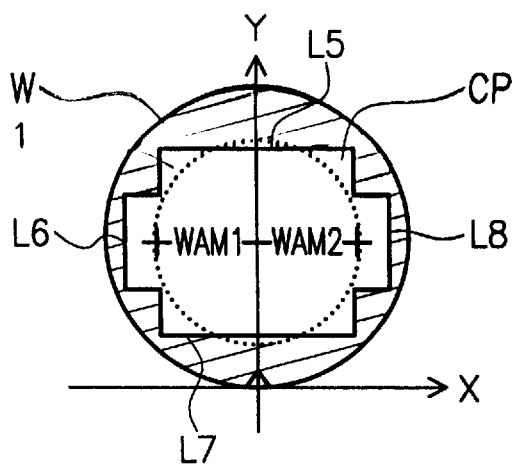
Figure 11:
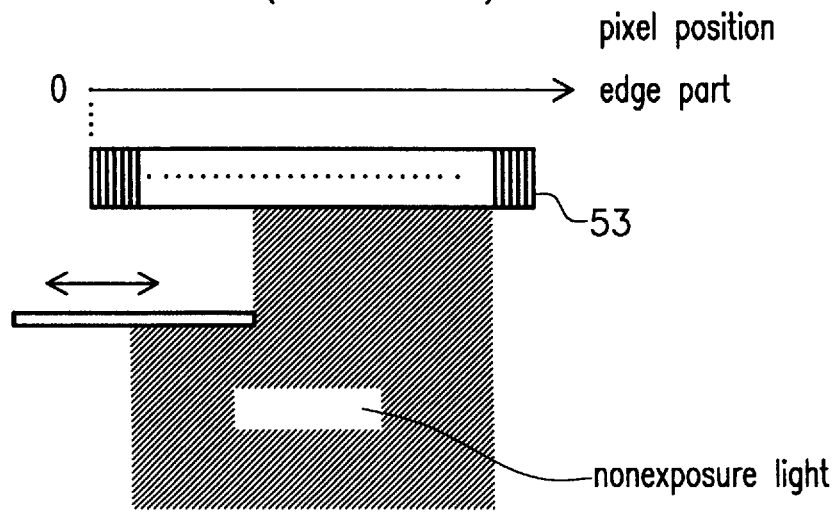
FIG. 11 shows a schematic of the determination of the transmitted light which passes through the outside of the peripheral edge area of the wafer with the device of FIG. 9.
Figure 12:
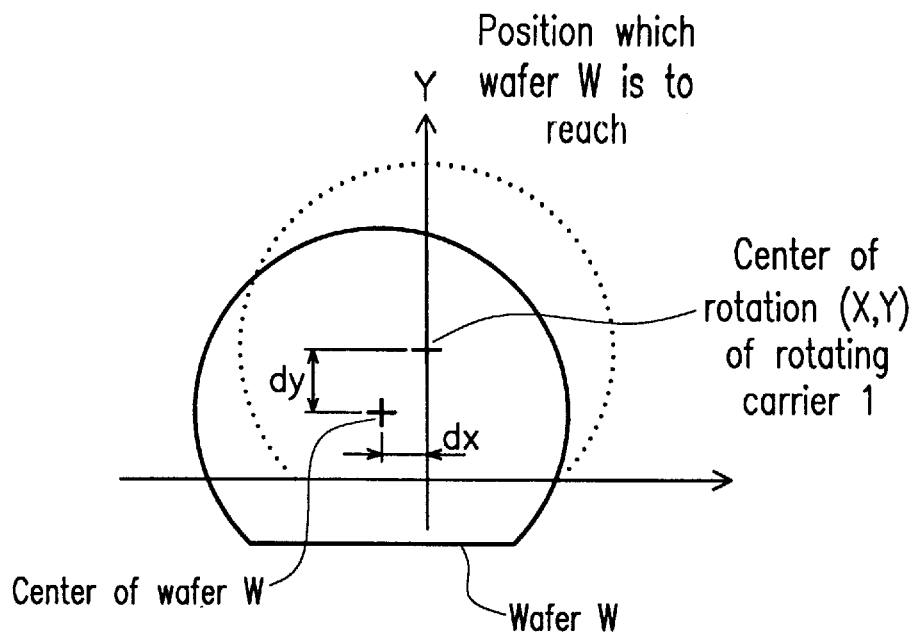
FIG. 12 shows a schematic of one known example for the correction of the coordinate data.
Figure 13A:
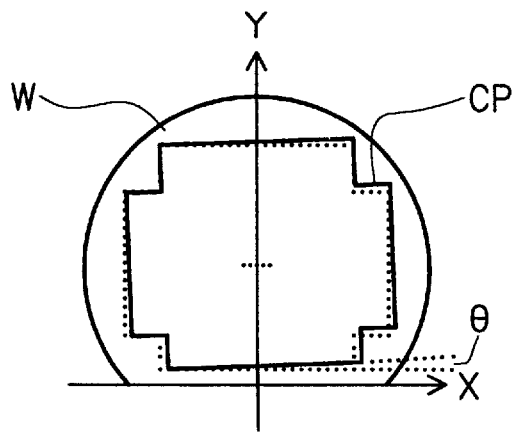
FIG. 13 shows a schematic of the state in which the circuit patterns are not formed in the predetermined positions therefor.
Figure 13B:
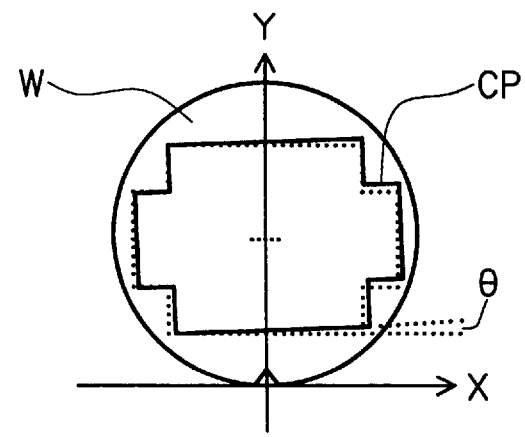
Figure 14:
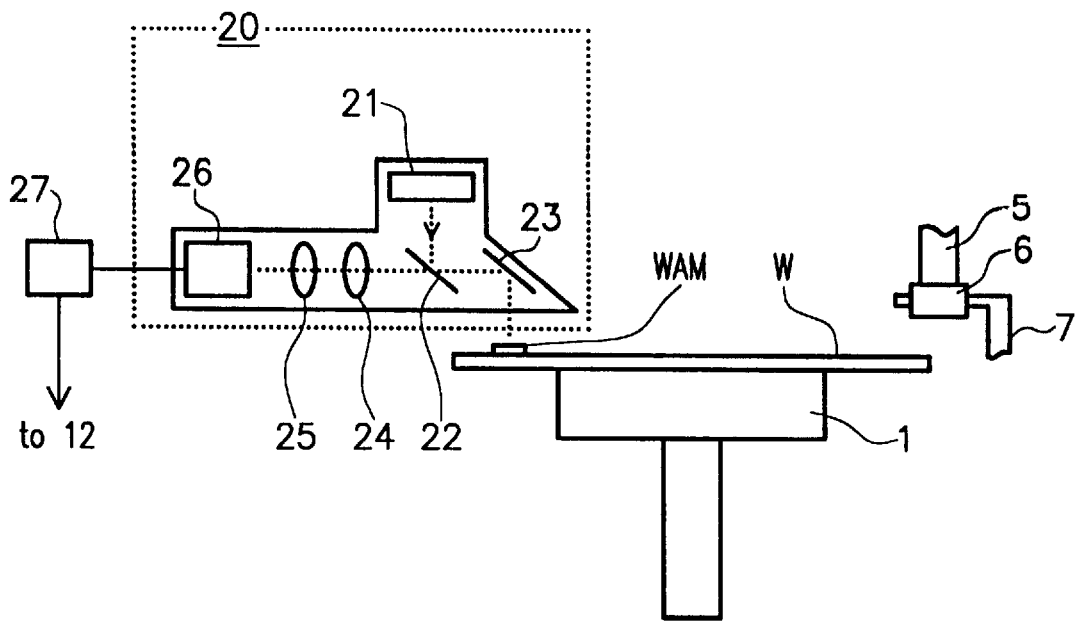
FIG. 14 shows a schematic of one arrangement of an alignment unit.
Figure 15:
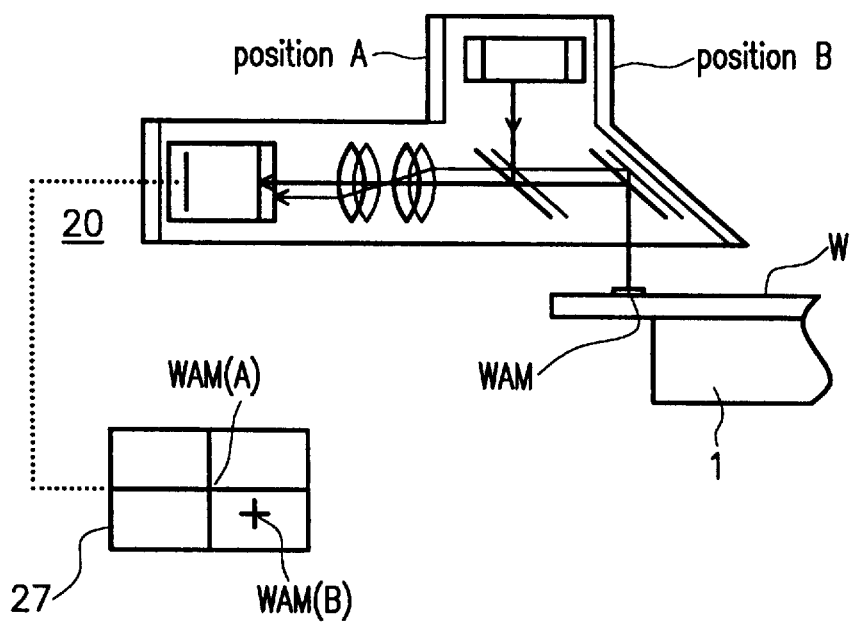
FIG. 15 shows a schematic of the effect of errors of the insertion position of the alignment unit.

FIG. 1 schematically shows a first embodiment of a device according to the invention for exposure of a peripheral area of a wafer W. In the device for exposure of the peripheral area of wafer W shown in FIG. 1, a prior art device for exposure of the peripheral area of a wafer as described above using FIG. 9 is provided with an arrangement to determine alignment marks WAM1, WAM2 which are located on wafer W, to compute the determination data, and to correct the amount of deviation. Thus, to avoid the necessity of repeating the descriptions given above, the same reference numerals have been used to designated those components of the FIG. 1 that are also found in the FIG. 9 device.

Figure 2A:
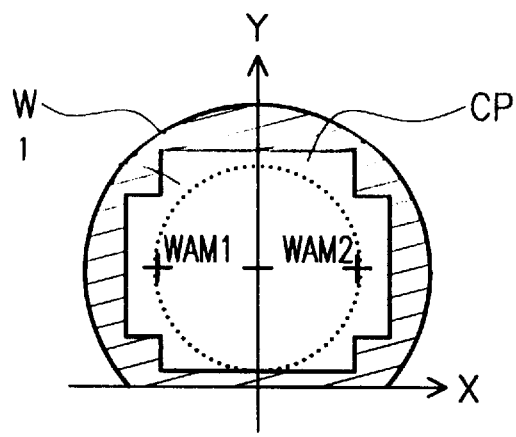
FIG. 2 shows a schematic of the exposure area and of alignment marks.
Figure 2B:
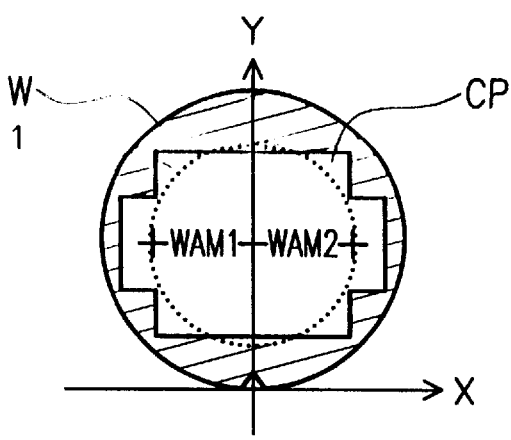

The arrangement is described in the following. In FIG. 1, reference number 14 identifies an alignment mark determination unit for determining alignment marks WAM1, WAM2 (FIG. 2). Alignment mark determination unit 14 comprises a CCD camera 81, a half mirror 82, a light source 83 for emitting nonexposure light, and a lens 84. The light source 83 can be, for example, either a light emitting diode which emits nonexposure light or an arrangement in which a filament lamp is combined with an optical filter which passes only the nonexposure light.

With alignment mark determination unit 14, the nonexposure light emitted from light source 83 is radiated via half mirror 82 and lens 84 onto alignment mark WAM1 or alignment mark WAM2 which is detected by means of CCD camera 81 via lens 84 and half mirror 82. Alignment mark determination unit 14 is mounted to retaining arm 7 integrally with the exit part 6, and therefore, is subjected to drive control by controlling of the X-carrier 8 and Y-carrier 10 with controller 12 so as to move together with exit part 6 in the X-Y directions by a predetermined amount.

The image data of alignment marks WAM1, WAM2 determined by means of CCD camera 81 are sent to controller 12 which functions to control the rotary drive device 2 for the rotating carrier, shutter drive device 43, X-carrier 8 and Y-carrier 10. Controller 12 also has the function of storage and computation of information on the angle of rotation of rotating carrier 1 determined by angle of rotation reading device 3, of the position information of X-carrier 8 and Y-carrier 10 which is determined by the means for determining the X-carrier position 9 and the means for determining the Y-carrier position 11, of the position information about the edge of wafer W which is determined by the means for determining the peripheral edge area of the wafer 13, and of the coordinate data of the exposure area of the unnecessary resist, as well as the function of storage and computation of the image data of alignment marks WAM1, WAM2.

In the following, using the device shown in FIG. 1 for exposing the peripheral area of a wafer, a process is described for exposing the peripheral area of a wafer in which a step-shaped unnecessary resist is exposed in the peripheral area of the wafer.

(1) Controller 12 stores the coordinate data of the exposure area for the X-Y coordinates which are shown in FIG. 2 and which intersect orthogonally, and of alignment marks WAM1, WAM2.

These coordinate data to be stored relate to an instant at which circuit pattern CP, i.e., the area of the unnecessary resist and alignment marks WAM1, WAM2, are present in predetermined positions on wafer W.

The X-direction and Y-direction of the X-Y coordinates shown here agree with the directions of movement of X-carrier 8 and Y-carrier 10 which move in orthogonally intersecting directions, as in the prior art.

The coordinate data here, furthermore, relate to an instant at which the center of the circular peripheral area of wafer W and the center of rotary carrier 1 coincide with one another.

Additionally, a correlation is established between these coordinate data and the information of the positions of X-carrier 8 and Y-carrier 10 which is determined by the means for determining the X-carrier position 9 and the means for determining the Y-carrier position 11.

Furthermore, for these coordinate data, the positional relationship is also considered between exit part 6 and the means for determining the peripheral edge area of the wafer 13, and the positional relationship between exit part 6 and the alignment mark determination unit 14.

Figure 3:
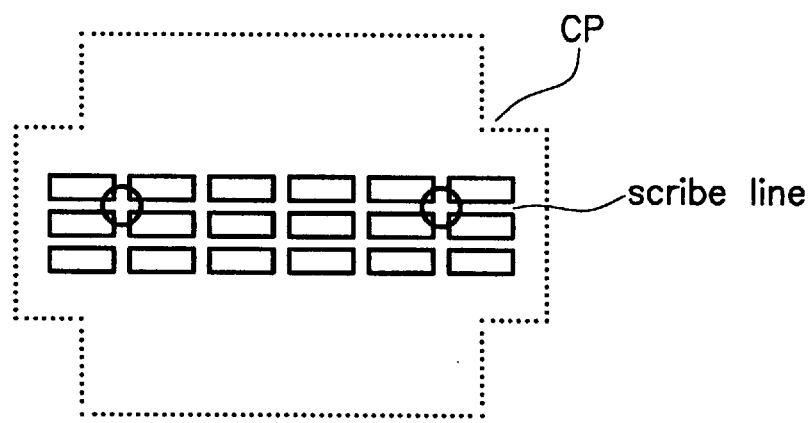
FIG. 3 shows a schematic of two predetermined points at the intersection points of scribe lines.

Moreover, controller 12 can store two predetermined points, instead of alignment marks WAM1 and WAM2, as alignment marks. Such predetermined points for use as alternative alignment marks are ones which have features like the intersection points of scribe lines which are present on the periphery of each chip within the area of circuit pattern CP, as is illustrated in FIG. 3.

In this case, the alignment marks WAM1, WAM2 are not also needed; this facilitates practical effort.

(2) X-carrier 8 and Y-carrier 10 are driven. Means for determining the peripheral edge area of wafer 13 which is installed in the retaining arm 7 is moved to the peripheral edge of wafer W. Nonexposure light is emitted from light emitting diode 51.

The position information of X-carrier 8 and Y-carrier 10 are determined by the means for determining X-carrier position 9 and by the means for determining Y-carrier position 11, and is sent to controller 12. This means that drive control of the X-carrier 8 and the Y-carrier 10 is a loop control.

(3) Rotary drive device 2 is driven. The rotating carrier 1 on which wafer W is placed and is held by suction, and which was transported by means of a transport device (not shown) is rotated once.

(4) During rotation of rotating carrier 1, by means of CCD array 53 and angle of rotation reading device 3, the positional information about the edge part of wafer W is determined, the above described angle of rotation of rotating carrier 1 being called the parameter. Then, emission of nonexposure light from light emitting diode 51 is stopped.

(5) The information as to the position of the peripheral edge area of above described wafer W is computed by controller 12, by which the "ori-fla" or "notch" position, and furthermore, the amount of deviation of the center of rotation of rotating carrier 1 from the center of wafer W are computed.

(6) On the basis of the above described computed data, rotary drive device 2 is driven and rotating carrier 1 is rotated until the "ori-fla" position becomes parallel to the X-axis of the X-Y coordinate system.

In the case of a "notch", rotary drive device 2 is driven and rotating carrier 1 is rotated until a straight line between the "notch" and the center of wafer W becomes parallel to the Y-axis.

Furthermore, by using the process disclosed in Japanese patent disclosure document HEI 5-3153, it can be confirmed whether the above described positioning has been done correctly, as was described above.

(7) Furthermore, based on the amount of deviation of the center of rotation of rotating carrier 1 from the center of wafer W which is computed in step (5), the coordinate data stored in step (1) are corrected.

(8) Based on the coordinate data corrected in step (7), X-carrier 8 and Y-carrier 10 are subjected to drive control. Alignment mark determination unit 14, held integrally with exit part 6 by retaining arm 7, is moved into a position in which alignment mark WAM1 is to be present.

(9) Nonexposure light is emitted from light source 83 of alignment mark determination unit 14. The image of alignment mark WAM1 is determined by means of CCD camera 81, and the image data (position data) are stored.

(10) Alignment mark determination unit 14 is moved, in the same way, to a position in which alignment mark WAM2 is to be present. The image of alignment mark WAM2 is determined and the image data (position data) are stored.

Figure 4:
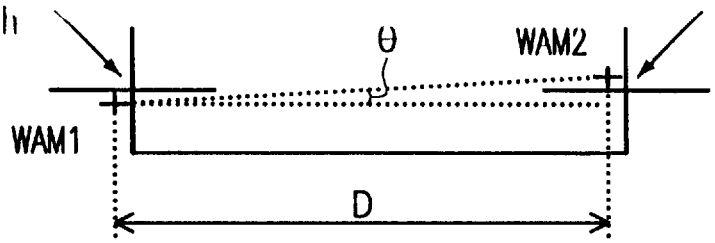
FIG. 4 shows a schematic of the slope of the alignment marks.

(11) As is shown in FIG. 4, on the basis of the image data of two alignment marks WAM1 and WAM2 as well as on the basis of distance D between the two alignment marks WAM1, WAM2 stored beforehand in step (1) in the X axis direction, the slope θ between the X axis direction and a line segment between the two alignment marks WAM1, WAM2, i.e., the amount of deviation θ of circuit pattern CP, is determined by computation. Rotating carrier 1 is rotated by this amount.

Figure 5:
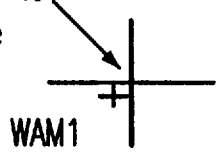
FIG. 5 shows a schematic of the states in which the slope of the alignment marks is less than or equal to a predetermined value.

(12) Above described steps (8) through (11) are repeated. It is confirmed whether correction of slope θ has been done correctly. In the case in which this correction has not been done correctly, the above described steps (8) through (11) are repeated until the value of slope θ is less than or equal to a predetermined value. FIG. 5 shows the state in which the value of slope θ is less than or equal to a predetermined value.

(13) The data of the positions in which two alignment marks WAM1, WAM2 are actually to be present, and the data of positions in which they are actually present, are computed. The difference between the two is determined. The coordinate data corrected in step (7) are corrected further.

(14) The emission of nonexposure light from light emitting diode 83 of alignment mark determination unit 14 (FIG. 1) is stopped.

(15) Based on the coordinate data corrected in step (13), X-carrier 8 and Y-carrier 10 are subjected to drive control. Thus, the position of the light irradiating from retaining arm 7, that is, from exit end 6, is moved to a predetermined initial position.

(16) Shutter drive device 43 is moved and shutter 41 is opened. Exposure light is emitted from exit end 6.

(17) Based on the coordinate data corrected in step (13), X-carrier 8 and Y-carrier 10 are subjected to drive control and a step-shaped exposure area is exposed.

(18) Furthermore, in the case in which the stroke lengths of the movements of X-carrier 8 and Y-carrier 10 by a pieset amount are not very great, after each exposure of the zone of the exposure area which can be exposed, rotating carrier 1 can be rotated 90°, and after rotation, the respective exposure area can be exposed.

In the device for exposure of the peripheral area of a wafer in the first embodiment, retaining arm 7, which holds alignment mark determination unit 14 and exit part 6 integrally, is subjected to drive control by means of X-carrier 8 and Y-carrier 10 is the X-Y directions. However, the same effect can be achieved, as in the device for exposure of the peripheral area according to the first embodiment, by attaching alignment mark determination unit 14 and exit part 6 integrally to one another, and by subjecting rotating carrier 1 provided with wafer W to drive control by means of X-carrier 8 and Y-carrier 10 in the X-Y directions by a preset amount, as in the device shown in FIG. 6 for exposure of the peripheral area of a wafer according to a second embodiment.

Figure 6:
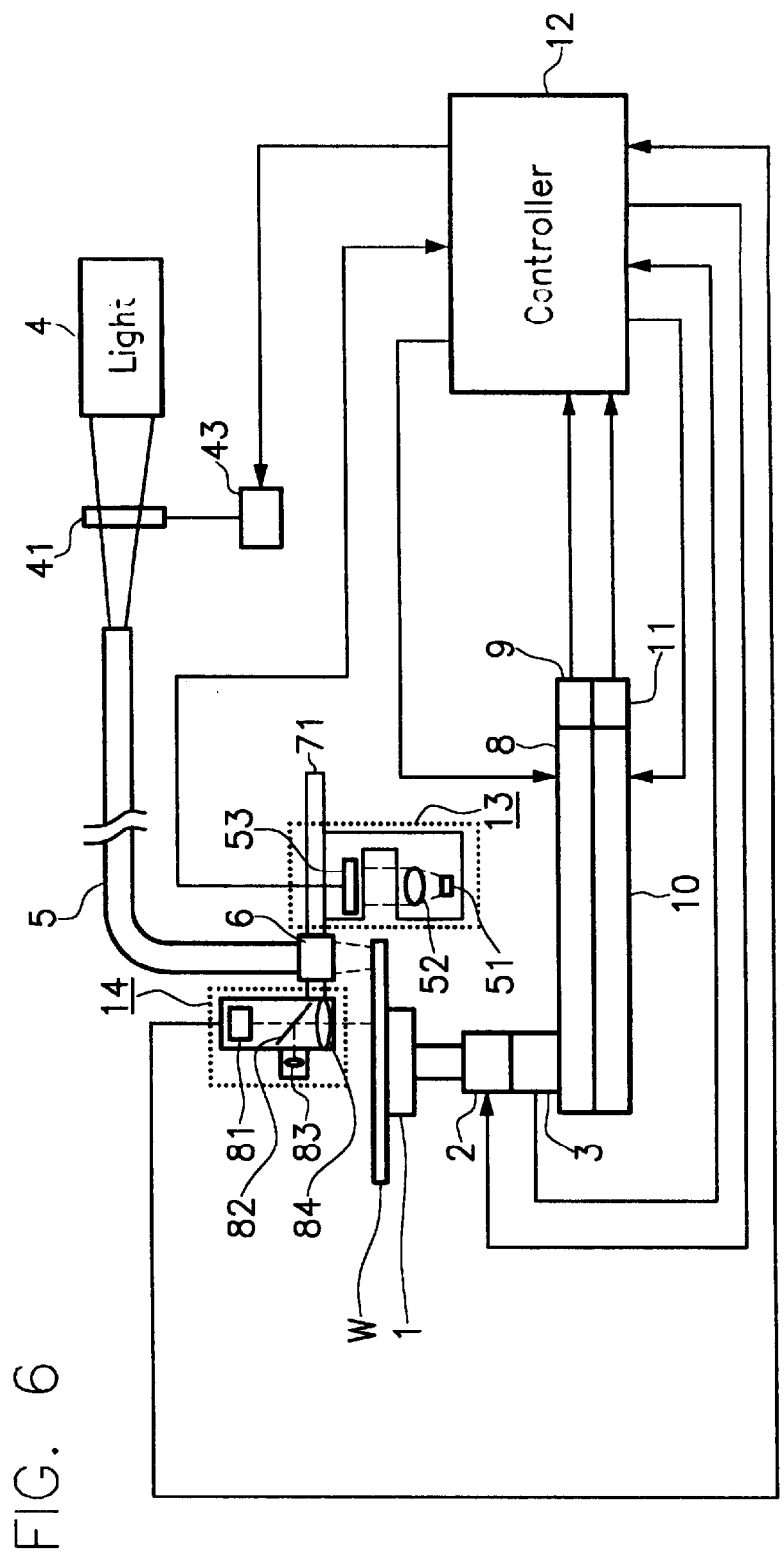
FIG. 6 shows a schematic of a second embodiment of a device according to the invention for exposure of the peripheral area of a wafer.

In FIG. 6, reference number 71 identifies an attachment component for attaching alignment mark determination unit 14 and exit part 6 integrally to one another in a predetermined position. The rotary drive device 2 and the angle of rotation reading device 3 are arranged integrally with one another and are attached on X-carrier 8 and Y- carrier 10. Rotating carrier 1 is, therefore, rotated by the drive of rotary drive device 2, of X-carrier 8 and of Y-carrier 10 and can furthermore be moved in the X-Y directions. Furthermore, the angle of rotation of rotating carrier 1 and its positions in the X-Y directions are determined by angle of rotation reading device 3, by means for determining the X-carrier position 9 and means for determining the Y-carrier position 11. The determination signals thereof are sent to controller 12. In this case parts which are provided with the same reference numbers as in FIG. 1 are the same material components as in FIG. 1.

In the following, a process for exposure of the peripheral area of a wafer is described using the device for exposure of the peripheral area of a wafer according to the second embodiment:

(a) As in step (1) in the first embodiment, controller 12 stores the X-Y coordinate data of the exposure area at the instant at which the center of the circular peripheral area of wafer W agrees with the center of rotating carrier 1. In these coordinate data the correlation to the position information of X-carrier 8 and Y-carrier 10 as well as the position relationships to exit part 6 and means for determining the peripheral area of the wafer 13 are considered.

(b) X-carrier 8 and Y-carrier 10 are driven. Rotating carrier 1 on which wafer W is placed is moved such that the edge part of wafer W is positioned in a position in which it is determined by means for determining the peripheral area of the wafer 13. Nonexposure light is emitted from light emitting diode 51.

The position informations of X-carrier 8 and Y-carrier 10 are determined by means for determining the X-carrier position 9 and by means for determining the Y-carrier position 11 and is sent to controller 12. This means that drive control of X-carrier 8 and Y-carrier 10 is loop control.

(c) As in steps (3) through (7) in the first embodiment, position information about the edge part of wafer W is determined, the angle of rotation of rotating carrier 1 being called the parameter, and it is subjected to computation at controller 12. The "ori-fla" position or the "notch" position and furthermore the amount of deviation of the center of rotation of rotating carrier 1 from the center of wafer W is computed.

Based on these computed data, rotary drive device 2 is driven and rotating carrier 1 is rotated until the "ori-fla" position becomes parallel to the X-axis of the X-Y coordinate system, and until in the case of "notch" a straight line which forms between the "notch" and the center of wafer W becomes parallel to the Y-axis.

Furthermore, based on the computed amount of deviation of the center of rotation of rotating carrier 1 from the center of wafer W, the coordinate data stored in step (1) are corrected.

(d) Based on the coordinate data corrected in step (c), X-carrier 8 and Y-carrier 10 are subjected to drive control. Rotating carrier 1 is moved such that alignment mark WAM1 is positioned on wafer W in a determination position of alignment mark determination unit 14 which is attached by attachment component 71 integrally to the exit part 6.

(e) Nonexposure light is emitted from light source 83 of alignment mark determination unit 14. The image of alignment mark WAM1 is determined by means of CCD camera 81, and the image data (position data) are stored.

(f) Rotating carrier 1 is moved such that alignment mark WAM2 is positioned on wafer W in a determination position of alignment mark determination unit 14. The image of alignment mark WAM2 is determined and the image data (position data) are stored.

(g) As in steps (11) to (14) in the first embodiment, the amount of deviation θ of circuit pattern CP is determined by computation, as is shown in FIGS. 4 and 5. Rotating carrier 1 is rotated according to this amount. Then, the processes of determination of alignment marks WAM1, WAM2, computation of the amount of deviation, and rotation of rotating carrier 1 are repeated until the value of slope θ is less than or equal to a stipulated value. Afterwards, the data of the positions in which two alignment marks WAM1, WAM2 are actually to be determined, and the data of the actually determined positions are computed and the difference between the two determined. The coordinate data corrected in step (c) are further corrected. Emission of the nonexposure light from light emitting diode 83 of alignment mark determination unit 14 is stopped.

(h) Based on the coordinate data corrected in step (g), rotary carrier 1 is moved by drive control of X-carrier 8 and Y-carrier 10 such that the initial position of the exposure area of wafer W is the position of light irradiation from exit end 6 which is attached by the attachment part.

(i) Shutter drive device 43 is driven. Shutter 41 is opened. Exposure light is emitted from exit end 6. Based on the coordinate data corrected in step (g), X-carrier 8 and Y-carrier 10 are driven, rotating carrier 1 is to subjected to drive control, and the step-shaped exposure area is exposed.

Furthermore, in the case in which the stroke lengths of the movements of X-carrier 8 and Y-carrier 10 are not very great, after each exposure of a zone of the exposure area which can be exposed, rotating carrier 1 can be rotated 90°, and after rotation, the respective exposure area can be exposed.

In the device for exposing the peripheral area of a wafer in the second embodiment, in addition to the same function as in the first embodiment, the advantages arise that the bottom area which the carriers have, compared to the bottom area in the first embodiment, becomes smaller, that the bottom area of the entire device can be made smaller, and that the device can be simplified and costs can be reduced because the rotating carrier 1 is on the X-carrier 8 and Y-carrier 10.

Furthermore, wear of fibers 5 by moving exit end 6 is prevented because exit end 6 can be attached to fibers 5. When exit end 6 is moved over the wafer W, as in the device for exposing the peripheral area of a wafer in the first embodiment, under certain circumstances, as a result of the motion, dust can form and fall and stick on wafer W. This problem can, however, be prevented because in the second embodiment exit part 6 is attached.

Figure 7:
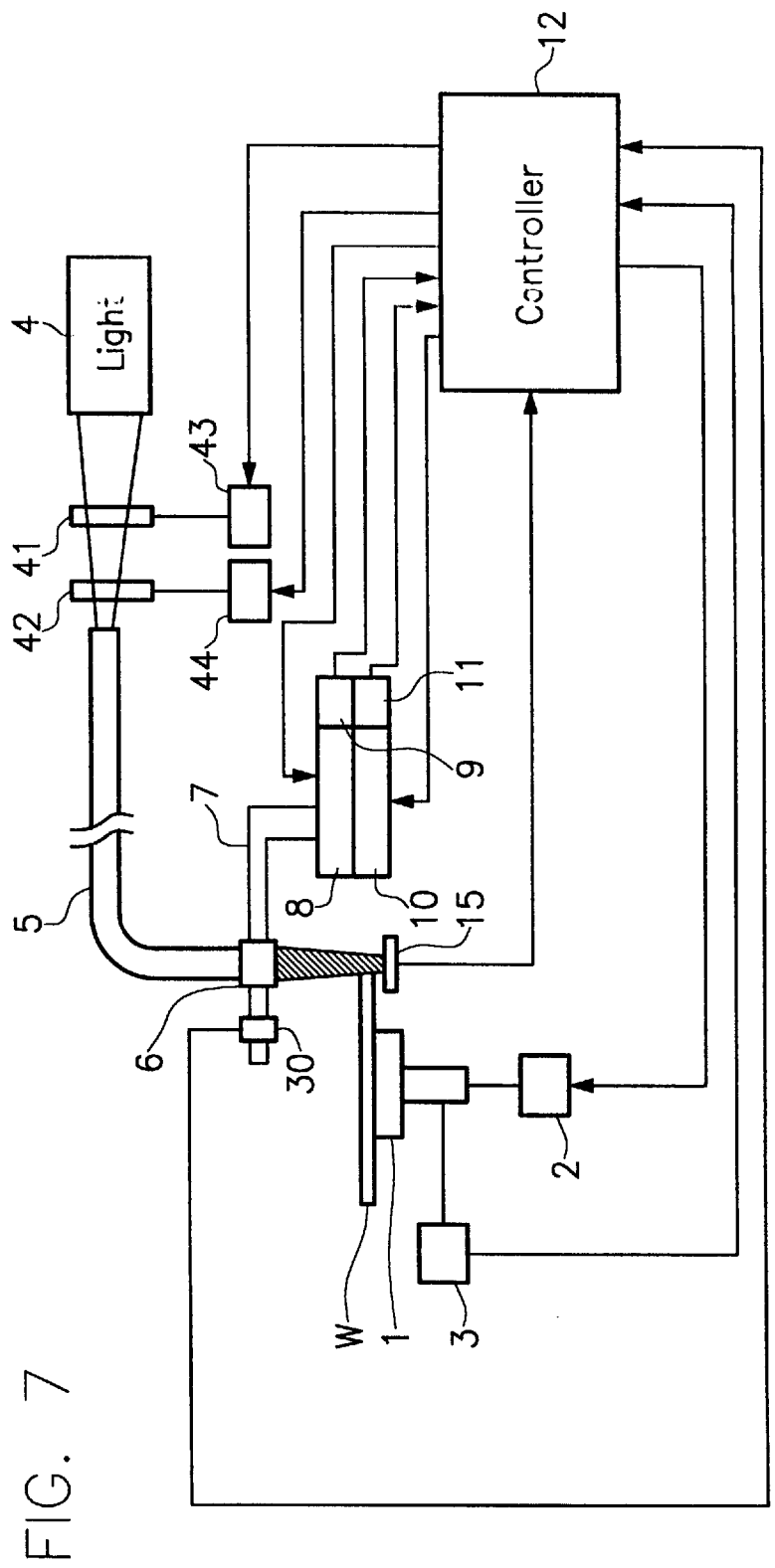
FIG. 7 shows a schematic of a third embodiment of a device according to the invention for exposure of the peripheral area of a wafer.

FIG. 7 shows a device for exposure of the peripheral area of a wafer according to a third embodiment of the invention. In FIG. 7, those parts which correspond to components shown in FIG. 1 have been given the same reference numbers as in FIG. 1.

In this embodiment, there are an optical filter 42 and a drive device 44 which inserts and removes the optical filter 42 in the optical path between the exposure light source 4 and one end of the optical fibers 5. Optical filter 42 filters out light radiated from light source 4 of exposure wavelengths so that the resist applied to wafer W is not exposed to the action of exposure light, and allows nonexposure light to pass. If optical filter 42 is inserted into the above described optical path, therefore, nonexposure light is emitted from exit part 6.

Furthermore, the CCD camera 30 which is used to detect the alignment marks WAM1, WAM2 is integrally connected with exit part 6 by means of the retaining arm 7, and moreover, is located in a position in which it can detect the image in the irradiation area of the nonexposure light emitted from exit part 6. As is described below, the image data of alignment marks WAM1, WAM2 detected by the CCD camera 30 are sent to controller 12. Furthermore, a CCD array 15 serves as a means for determining the wafer position.

Here, controller 12 functions to control the rotary drive device 2 for the rotating carrier, shutter drive device 43, drive device 44 for the optical filter 42, X-carrier 8 and Y-carrier 10. Additionally, controller 12 also has the function of storage and computation of information about the angle of rotation of rotating carrier 1 determined by means of rotating angle reading device 3, the position information of X-carrier 8 and Y-carrier 10 which is determined by the means for determining the X-carrier position 9 and by the means for determining the Y-carrier position 11, position information about the edge of wafer W which is determined by the CCD array 15, and the coordinate data of the exposure area of the unnecessary resist, as well as the storage and computation of the image data of alignment marks WAM1, WAM2.

In the following, exposure of the peripheral area of a wafer is described using the third example:

(A) As in the first embodiment, the coordinate data of the exposure area for the X-Y coordinates shown in FIG. 2 and the alignment marks WAM1, WAM2 are stored by controller 12.

These coordinate data relate to an instant at which the circuit pattern CP, i.e., the area of the unnecessary resist, and alignment marks WAM1, WAM2 are present in predetermined positions on the wafer W.

The X-direction and Y-direction of the X-Y coordinates coincide with the directions of movement of the X-carrier 8 and the Y-carrier 10, which move in orthogonally intersecting directions.

The coordinate data, here, also relate to an instant at which the center of the circular peripheral area of wafer W and the center of rotating carrier 1 coincide with one another.

Furthermore, a correlation is also established between these coordinate data and information of the positions of X-carrier 8 and Y-carrier 10 which is determined by the means for determining the X-carrier position 9 and the means for determining the Y-carrier position 11.

Additionally, for these coordinate data, the positional relationship between the exit part 6 and the CCD array 15, and the positional relationship between exit part 6 and the CCD camera 30 are considered.

Moreover, two points of the intersection points of scribe lines which are present on the periphery of each chip within the area of circuit pattern CP and which are predetermined can be stored as alignment marks by controller 12 instead of the alignment marks WAM1 and WAM2, as is illustrated in FIG. 3.

(B) Drive device 44 inserts optical filter 42 into the optical path between the light source 4 and one end of above described optical fibers 5 so that only nonexposure light passes from light source 4.

(C) After X-carrier 8 and Y-carrier 10 have been subjected to drive control, as in the first embodiment, and after exit part 6 is moved up to the peripheral edge area of wafer W, shutter drive device 43 is driven and shutter 41 is opened. Nonexposure light is emitted from exit part 6.

The nonexposure light emitted, via optical filter 42, from exit part 6 is partially shielded by wafer W and passes through the outside of the peripheral edge border area of wafer W. This transmitted light is detected by the CCD array 15.

(D) Rotary drive device 2 is driven. Rotating carrier 1, on which the wafer W is seated and is held by suction, is rotated once.

(E) During one rotation of rotating carrier 1, position information on the peripheral edge area of wafer W is determined by means of the CCD array 15 and the angle of rotation reading device 3, the angle of rotation of rotating carrier 1 being called the parameter, as in the first embodiment.

(F) As in steps (5) through (7) in the first embodiment, the rotating carrier 1 is rotated until the "ori-fla" position or "notch" position comes to a predetermined position. The coordinate data stored in step (1) are corrected.

(G) Based on the corrected coordinate data, X-carrier 8 and Y-carrier 10 are subjected to drive control. CCD camera 30 and the position of light irradiating from exit part 6 are moved into a position in which alignment mark WAM1 is to be present.

(H) Nonexposure light is radiated from exit end 6 onto alignment mark WAM1. The image of this alignment mark WAM1 is determined by CCD camera 30 and the image data (position data) are stored.

(I) CCD camera 30 and the position of light irradiating from the exit part 6 are moved, in the same manner, to a position in which alignment mark WAM2 is to be present. The image of alignment mark WAM2 is determined and the image data (position data) are stored.

(J) Then, as in steps (10) to (13) in the first embodiment, the amount of deviation θ of circuit pattern CP is determined by computation. Rotating carrier 1 is rotated by this amount. The data of the positions in which the two alignment marks WAM1, WAM2 are actually to be present, and the data of the positions in which they are actually present, are computed, and the difference between the two is determined. The coordinate data corrected beforehand are further corrected.

(K) Shutter drive device 43 is moved and shutter 41 is opened. Then, optical filter 42 is removed by the drive device 44 from the optical path between the light source 4 and the end of the optical fibers 5 (FIG. 7).

(L) Then, as in steps (15) to (18) in the first embodiment, the step-shaped exposure area is exposed.

In the third embodiment, using optical filter 42, nonexposure light is emitted from exit part 6. Therefore, the means for determining the peripheral edge area of wafer W and the means for determining alignment marks WAM1, WAM2 can be positioned more easily than in the first embodiment. Here, in particular, by the measure by which the retaining arm 7 holds only exit part 6 and CCD camera 30, the load on X-carrier 8 and Y-carrier 10 is less than in the first embodiment, in which alignment mark determination unit 14, which has CCD camera 81, half mirror 82, light emitting diode 83 for emitting nonexposure light and lens 84, the means for determining the peripheral edge area of the wafer 13 which includes light emitting diode 51, lens 52 for conversion of the above described nonexposure light into parallel light and of CCD array 53, as well as the exit part 6 are held. In this way, the size of the two carriers can be reduced.

Figure 8:
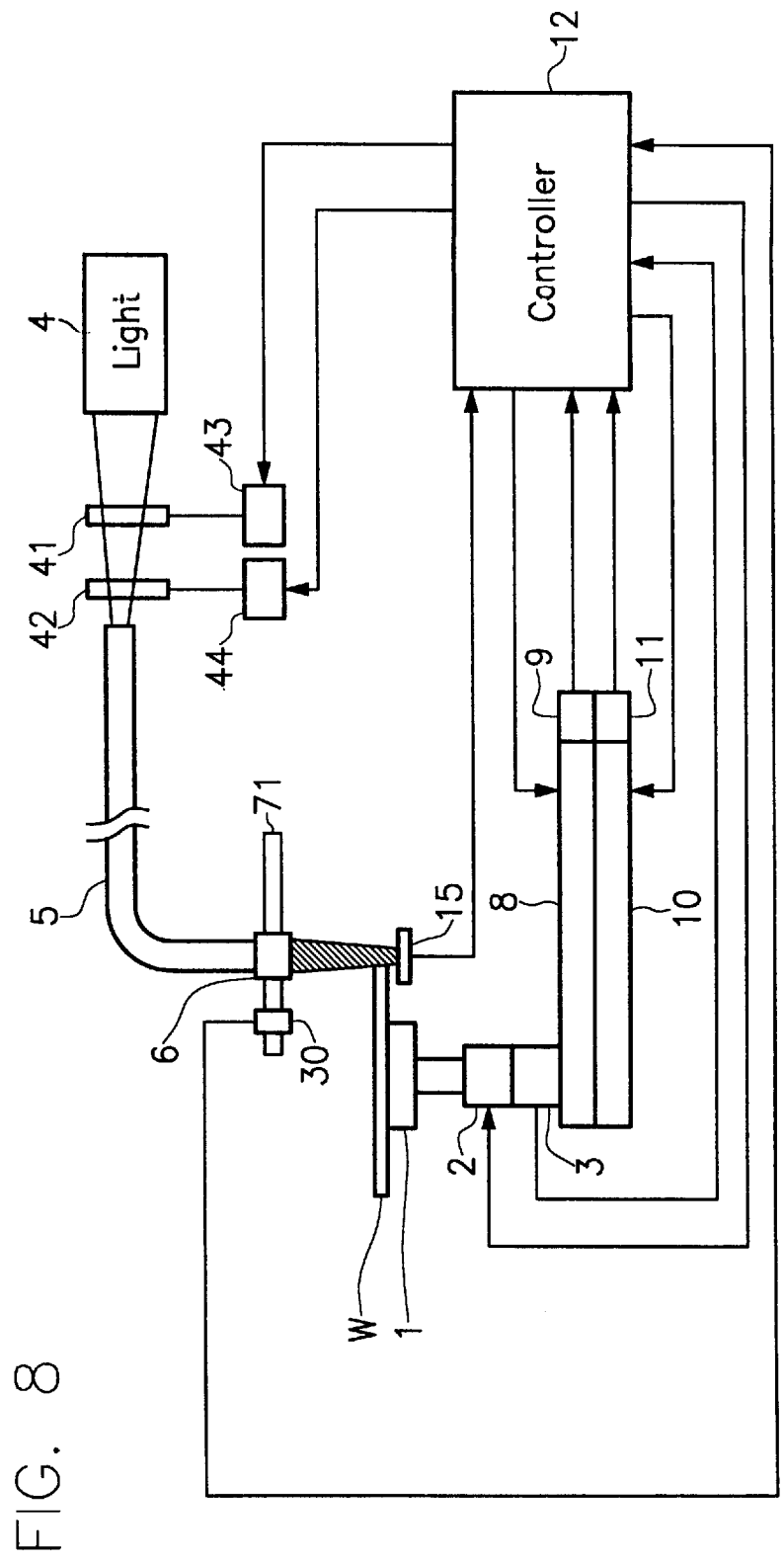
FIG. 8 shows a schematic of a fourth embodiment of a device according to the invention for exposure of the peripheral area of a wafer.

Also in the device for exposure of the peripheral area of a wafer in the third embodiment, as in the device shown in FIG. 8, for exposure of the peripheral area of a wafer according to the fourth embodiment, the CCD camera 30 and exit part 6 can be attached integrally to one another and rotating carrier 1, on which wafer W is placed, is subjected to drive control by a predetermined amount by means of the X-carrier 8 and the Y-carrier 10 in the X-Y directions.

In FIG. 8, reference numeral 71 indicates the attachment component for integrally connecting the CCD camera 30 and exit part 6 to one another in a predetermined position. Furthermore, rotary drive device 2 and angle of rotation reading device 3 are integrally connected with one another and are attached on X-carrier 8 and Y-carrier 10. Rotating carrier 1 is, therefore, rotated by driving rotary drive device 2, and can be moved, furthermore, in the X-Y directions by X-carrier 8 and Y-carrier 10. The angle of rotation of rotating carrier 1 and its positions in the X-Y directions are determined by means of the angle of rotation reading device 3, by the means for determining the X-carrier position 9, and the means for determining the Y-carrier position 11. The determination signals thereof are send to controller 12. In the FIG. 8, parts which are the same as components shown in FIG. 7 are provided with the same reference numerals as in FIG. 7.

In the following, a process for exposure of the peripheral area of a wafer is described using the device for exposing the peripheral area of the wafer according to the fourth embodiment:

(a') As in step (A) in the third embodiment, the X-Y coordinate data of the exposure area and alignment marks WAM1, WAM2 are stored by controller 12 at the instant at which the center of the circular peripheral area of wafer W coincides with the center of the rotating carrier 1, and at which alignment marks WAM1, WAM2 are present in predetermined positions on wafer W. For these coordinate data, the correlation to the position information of X-carrier 8 and Y-carrier 10 as well as the positional relations with respect to the exit part 6, CCD array 15 and CCD camera 30 are considered.

(b') Drive device 44 for optical filter 42 is driven so as to insert the optical filter 42 into the optical path between light source 4 and an end of the optical fibers 5 so that only nonexposure light passes from the light source 4.

(c') X-carrier 8 and Y-carrier 10 are subjected to drive control. Rotating carrier 1 is moved such that the edge part of wafer W is positioned in a light irradiation area in which nonexposure light is emitted from exit part 6 via filter 42. Then, shutter drive device 43 is driven and shutter 41 is opened.

This nonexposure light is partially shielded by wafer W and passes through the outside of the peripheral edge border area of wafer W. This transmitted light is detected by the CCD array 15.

(d') As is steps (D) through (F) in the third embodiment, the position information about the edge part of wafer W is determined, the angle of rotation of rotating carrier 1 being called the parameter and being subjected to computation in controller 12. The "ori-fla" position or the "notch" position and the amount of deviation of the center of rotation of rotating carrier 1 from the center of wafer W are also computed.

Based on these computed data, rotary drive device 2 is driven and rotating carrier 1 is rotated until the "ori-fla" position becomes parallel to the X-axis of the X-Y coordinate system, and in the case of the "notch," until a straight line between the "notch" and the center of wafer W becomes parallel to the Y-axis.

Furthermore, based on the amount of deviation of the center of rotation of rotating carrier 1 from the center of wafer W, the coordinate data stored in step (1) are corrected.

(e') Based on the coordinate data corrected in step (d'), X-carrier 8 and Y-carrier 10 are subjected to drive control. Rotating carrier 1 is moved such that alignment mark WAM1 is positioned in the predetermined position of CCD camera 30 and of the light irradiating position from exit part 6.

(f') Nonexposure light is radiated from exit end 6 onto the alignment mark WAM1. The image of this alignment mark WAM1 is determined by means of CCD camera 30, and the image data (position data) are stored.

(g') Rotating carrier 1 is moved in the same way, such that alignment mark WAM2 is positioned in the predetermined position of the CCD camera 30 and in the light irradiating position from exit part 6. The image of alignment mark WAM2 is determined and the image data (position data) are stored.

(h') Then, as in steps (I) to (K) in the third embodiment, by computation or the like of the above described image data (position data), rotating carrier 1 is rotated such that the amount of deviation θ of circuit pattern CP is less than or equal to a predetermined value, the data of the positions in which two alignment marks WAM1, WAM2 are actually to be present, and the data of the positions in which they are actually present, are computed, the difference between the two is determined, and the previously corrected coordinate data are further corrected.

Then, optical filter 42 is removed from the optical path between light source 4 and the end of the optical fibers 5, and the step-shaped exposure area is exposed.

In the fourth embodiment, as in the third example, using optical filter 42, nonexposure light is emitted from exit part 6. Therefore, the means for determining the peripheral edge area of wafer W and the means for determining alignment marks WAM1, WAM2 can be more easily positioned than in the second embodiment.

Furthermore, the advantages arise here that the bottom area which the carriers have, compared to the bottom area in the first embodiment, is smaller, that the bottom area of the entire device can be made smaller, and that the device can be simplified and costs can be reduced, because rotating carrier 1 is on the X-carrier 8 and Y-carrier 10, as in the second embodiment.

Furthermore, the wear of fibers 5 due to movement of exit part 6 is prevented because exit end 6 can be attached to fibers 5. The problems which occur when exit part 6 is moved over wafer W, i.e., that dust forms and falls and sticks on wafer W, can thus be likewise prevented.

ACTION OF THE INVENTION

As was described above, the unnecessary resist is not exposed such that a singular point with respect to shape is assumed, such as "ori-fla", "notch", or the like. Rather, exposure is performed in which, based on the above described singular point with respect to shape, the position of the wafer is adjusted, in which, then, the circuit pattern is further observed, in which the position of the wafer is subjected to fine adjustment such that the above described circuit pattern is positioned in a predetermined position, and in which a circuit pattern is assumed. Therefore, the exposure of the peripheral area of a wafer to remove the unnecessary resist of a step shape in a development process can be performed with high accuracy and ease, even if the position in which the circuit pattern is formed in a preceding process has errors.

The above described fine adjustment is performed based on the predetermined two points of the above described pattern or based on position information of two alignment marks, which have a preset relationship with respect to the above described pattern, and which are arranged separately from the pattern. If, in particular, the predetermined two points of the pattern are used, it is not necessary to also position alignment marks; this facilitates practical effort.

Furthermore, with certain features of the invention the following effects are obtained:

(1) Due to the wafer observation means for observing the errors in the position which occurred in the preceding process by which the circuit pattern was formed, an additional observation device is unnecessary.

(2) The exit part of the optical fibers and the above described observation means are fixed integrally such that they are in a predetermined positional relationship to one another. They can furthermore be moved in orthogonal directions.

The movement coordinate systems of the exit end and of the observation means therefore agree fully with one another.

Accordingly, correction of the errors in the position in which the circuit pattern is formed can always be achieved with high accuracy, and therefore, a positioning device with high accuracy for the observation means, which is necessary if the above described coordinate systems are independent, is no longer necessary.

(3) Furthermore, the measure by which an observation means is subjected to drive control, by which the predetermined two points of the pattern on the wafer or the two alignment marks which have a predetermined relationship to the pattern and which are positioned separately from the pattern are determined and stored separately, makes several alignment units unnecessary. Therefore, a small device for exposing the peripheral area of a wafer with low costs can be devised.

Additionally, the invention other features of the invention have the following effects:

(1) An additional observation device is unnecessary due to the wafer observation means for observing the errors in the position in which the circuit pattern was formed in the preceding process.

(2) The exit end of the optical fibers and the above described observation means are attached integrally such that they are in a predetermined position relationship to one another. Furthermore, the swivelling rotating carrier on which the wafer is placed can be moved in orthogonal directions. The correlation between the position of the exit end and the observation means which are attached integrally to one another and the position of the rotating carrier on which the wafer is placed, therefore, remains the same.

As a result, correction of the errors of the position in which the circuit pattern is formed can always be achieved with high accuracy, and therefore, there is no longer any need for a positioning device with high accuracy for the observation means, which is necessary, if the above described coordinate systems are independent.

(3) Furthermore, the measure by which the rotating carrier is subjected to drive control, by which the predetermined two points of the pattern on the above described wafer or the two alignment marks which have a predetermined relationship to the above described pattern and which are positioned separately from the above described pattern, are determined and stored separately, make several alignment units unnecessary. Therefore, a small device for exposing the peripheral area of a wafer with low costs can be devised.

It is to be understood that although preferred embodiments of the invention has been described, various other embodiments and variations may occur to those skilled in the art. Any such other embodiments and variations which fall within the scope and spirit of the present invention are intended to be covered by the following claims.

What we claim is:

1. Device for exposing a peripheral area of a semiconductor wafer having a peripheral edge area which is provided with a singular shaped area and having a surface on which a photoresist has been applied and a pattern formed, said surface having unnecessary resist outside an area in which the pattern is formed, comprising:

a rotating carrier for fixing said wafer; a rotating carrier drive means for rotating said rotating carrier;

an angle of rotation reading means for determining an angle of rotation of the rotating carrier;

a light source part for emitting exposure light;

optical fibers having an exit part for irradiating a peripheral edge area of the surface of the wafer on which the photoresist has been applied with exposure light from the light source part;

an observation means for observing the location of alignment marks on said surface of the wafer, said alignment marks having a predetermined positional relationship relative to the pattern on said surface of the wafer;

a means for determining the peripheral edge area, which determines positional information relative to the location of the peripheral edge area of the wafer;

a drive means for driving the exit part of the optical fibers and the observation means in two orthogonally intersecting directions on the same side of the wafer; and a control element which controls said drive means for moving the retaining means in said two orthogonally intersecting directions, and which causes the unnecessary resist outside the area on the wafer in which the pattern is formed to be exposed to exposure light radiated from the exit part based upon the location of the alignment marks determined by said observation means and the location of the peripheral edge area determined by said means for determining.

2. Device for exposing a peripheral area of a semiconductor wafer according to claim 1, wherein said light source part also has means for selectively, alternatively, emitting nonexposure light; and wherein said means for determining the peripheral edge area acquires said positional information about the peripheral edge area of the wafer by detecting nonexposure light radiated from the optical fibers onto the peripheral edge area of the wafer.

3. Device for exposing a peripheral area of a semiconductor wafer having a peripheral edge area which is provided with a singular shaped area and having a surface on which a photoresist has been applied and a pattern formed, said surface having unnecessary resist outside an area in which the pattern is formed, comprising:

a rotating carrier for fixing said wafer;

a rotating carrier drive means for rotating said rotating carrier;

an angle of rotation reading means for determining an angle of rotation of the rotating carrier;

a means for driving the rotating carrier in two orthogonally intersecting directions;

a means for determining orthogonal positions which determines positions of the rotating carrier in said orthogonal directions;

a light source part for emitting exposure light;

optical fibers having an exit part for irradiating a peripheral edge area of the surface of the wafer on which the photoresist has been applied with exposure light from the light source part;

an observation means for observing the location of alignment marks on said surface of the wafer, said alignment marks having a predetermined positional relationship relative to the pattern on said surface of the wafer;

a means for determining the peripheral edge area, which determines positional information relative to the location of the peripheral edge area of the wafer; and a control element which controls said means for driving for moving the rotating carrier in said two orthogonally intersecting directions, and which causes the unnecessary resist outside the area on the above described wafer in which the pattern is formed to be exposed to said exposure light based upon the location of the alignment marks determined by said observation means and the location of the peripheral edge area determined by said means for determining.

4. Device for exposing a peripheral area of a semiconductor wafer according to claim 3, wherein said light source part also has means for selectively, alternatively, emitting nonexposure light; and wherein said means for determining the peripheral edge area acquires said positional information about the peripheral edge area of the wafer by detecting nonexposure light radiated from the optical fibers onto the peripheral edge area of the wafer.

* * * * *